United States Patent
Kirmse

(10) Patent No.: US 6,998,221 B2
(45) Date of Patent: Feb. 14, 2006

(54) METHOD FOR FORMING A VIA IN A SUBSTRATE

(75) Inventor: Karen H R Kirmse, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 236 days.

(21) Appl. No.: 10/444,340

(22) Filed: May 23, 2003

(65) Prior Publication Data

US 2004/0234894 A1 Nov. 25, 2004

(51) Int. Cl.
*C03C 25/68* (2006.01)

(52) U.S. Cl. .................... 430/313; 430/311; 430/316; 216/51; 216/67; 216/63

(58) Field of Classification Search ............. 430/311, 430/313, 316; 216/51, 67, 63

See application file for complete search history.

(56) References Cited

U.S. PATENT DOCUMENTS 6,524,875 B1 * 2/2003 Figura et al. .............. 438/46

* cited by examiner

*Primary Examiner*—John A. McPherson
*Assistant Examiner*—Daborah Chacko-Davis
(74) *Attorney, Agent, or Firm*—Peter K. McLarty; W. James Brady, III; Frederick J. Telecky, Jr.

(57) ABSTRACT

The present invention provides a method for forming a via (e.g., a trench, via or contact) in a substrate. The method, in one embodiment of the invention, includes patterning an opening 220 in a photoresist layer 210 located over an intermediate layer located over a substrate. In that particular embodiment the opening 220 has a predetermined width 230. The method may further include etching into the intermediate layer 120 such that an intermediate opening 310 is formed, the intermediate opening 310 having a decreasing width that terminates at a targeted width 320 less than the predetermined width 230. Additionally, the method may include continuing the etching within the intermediate opening 310 and at least partially into the substrate 110 to form a via opening 510 in the substrate. In this particular embodiment, the width 520 of the via opening 510 is substantially equal to the targeted width 320.

18 Claims, 7 Drawing Sheets

METHOD FOR FORMING A VIA IN A SUBSTRATE

TECHNICAL FIELD OF THE INVENTION

The present invention is directed, in general, to a method for forming an opening and, more specifically, to a method for forming a via in a substrate.

BACKGROUND OF THE INVENTION

With the increasing sophistication and expertise in the fabrication of semiconductor devices, coupled with a demand for increasingly smaller die sizes, semiconductor device geometries, such as, for example, active transistor devices, are becoming smaller. The decreasing size of the active transistor devices currently requires that the interconnects contacting those active transistors also reduce in size. Presently, however, limits in photolithographic critical dimensions hamper this effort.

Currently, in an effort to reduce the width of the interconnects, those skilled in the semiconductor industry use a customized etch that causes the sidewalls of the interconnect vias to be sloped inwards. In other words, the sidewalls of the interconnect vias are not substantially vertical. Thus, where the top of the interconnect via has a width of X, the bottom of the interconnect via has a width substantially less than X. Obviously, the difference in width between the top of the interconnect via and the bottom of the interconnect via depends on the thickness of the layer the interconnect via is being formed within, as well as the sidewall angles. The result, however, is that the width of the lower portion of the interconnect via is substantially less than the width of the opening of the via. Unfortunately, this process is difficult to control.

Accordingly, what is needed in the art is a new method for forming vias in a substrate that does not experience the drawbacks of the prior art methods.

SUMMARY OF THE INVENTION

To address the above-discussed deficiencies of the prior art, the present invention provides a method for forming a via in a substrate. The method, in one embodiment of the invention, includes patterning an opening in a photoresist layer located over an intermediate layer located over a substrate. In that particular embodiment the opening has a predetermined width. The method may further include etching into the intermediate layer such that an intermediate opening is formed, the intermediate opening having a decreasing width that terminates at a targeted width less than the predetermined width. Additionally, the method may include continuing the etching within the intermediate opening and at least partially into the substrate to form a via opening in the substrate. In this particular embodiment, the width of the via opening is substantially equal to the targeted width.

The present invention further includes a method of manufacturing an integrated circuit using the aforementioned method of manufacturing a via, however, in this embodiment the via is within an interlevel dielectric layer. In addition to forming the via in an interlevel dielectric layer, the method of manufacturing an integrated circuit includes forming transistors over a semiconductor substrate.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention, in contrast to the prior art, uses (among other things) an intermediate layer and the differences in etch rates between the intermediate layer and a substrate located there below, to manufacture vias in that substrate that have widths substantially less than currently achievable in the art. More specifically, the present invention has recognized that if the material composition or etchant type used to create an opening in the intermediate layer (which happens to be a sacrificial layer) can be tailored such that its sidewalls are sloped inwards after etching, the width of the resulting via in the substrate may be substantially reduced.

The present invention has further recognized that (among other things) the etch rate of a layer of material has an impact on the profile of its sidewalls. Accordingly, it has been observed that slower etch rates provide inward sloping sidewalls and faster etch rates provide substantially vertical sidewalls. Therefore, as will be detailed below, if the etch rate of the intermediate layer is reduced (whether it is because of material composition or etchant used) and the etch rate of the substrate is increased (whether it is because of material composition or etchant used), respectively, then the profile of the opening in the intermediate layer would be sloping inwards and the profile of the opening in the substrate would be substantially vertical. As the base of the opening in the intermediate layer would substantially define the width of the opening in the substrate, a narrower via width could be obtained than is currently obtainable in the prior art.

Referring now to FIGS. 1–5, illustrated are cross-sectional views of detailed manufacturing steps instructing how one might, in an advantageous embodiment, manufacture a via in a substrate in accordance with the principles of the present invention. Before turning to the FIGS. 1–5 it should be noted that the term via, as used herein, is defined to include all openings, including trenches, vias and contact openings, formed within a substrate in a microelectronics or optoelectronics device. Accordingly, the present invention is not limited only to traditional via structures.

Figure 1:
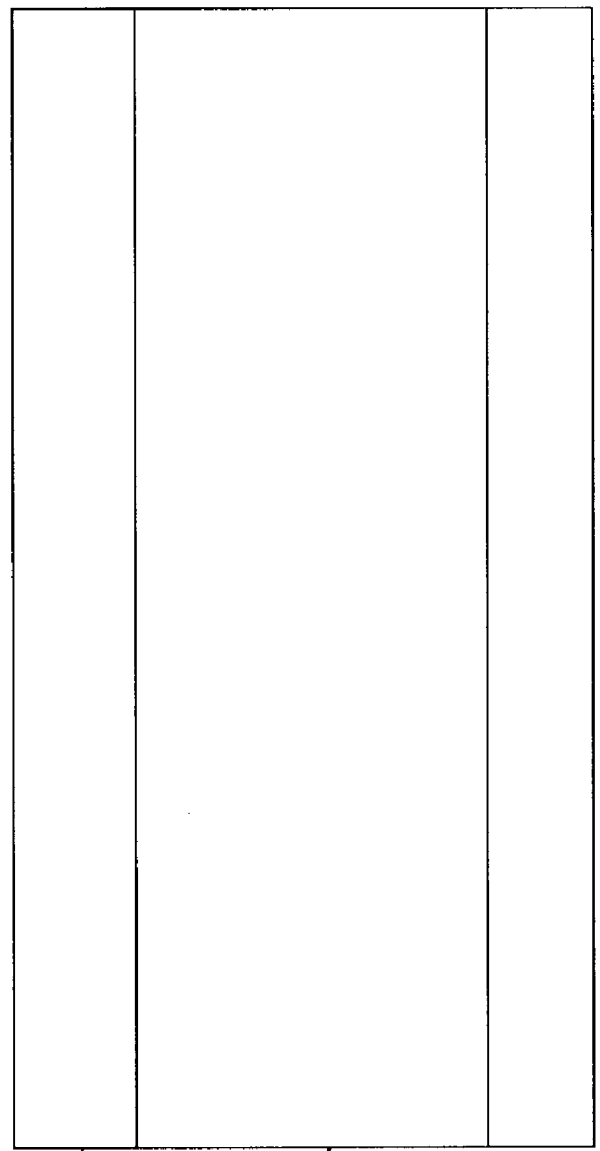
FIG. 1 illustrates a cross-sectional view of certain layers thru which a via structure will be subsequently formed in accordance with the principles of the present invention.

With initial reference to FIG. 1, illustrated is a cross-sectional view of certain layers thru which a via structure 100 will be subsequently formed in accordance with the principles of the present invention. The partially completed via structure 100 shown in the embodiment of FIG. 1 includes a substrate 110. The substrate 110 may, in an exemplary embodiment, be any layer located in a microelectronics device, optoelectronics device, or any other known device. For example, in the particular embodiment shown, the substrate 110 is a dielectric layer, however, in certain other embodiments the substrate 110 may be a wafer itself or a layer located above the wafer (e.g., epitaxial layer). While the present invention will be discussed using a dielectric layer, and more particularly an interlevel dielectric layer, as the substrate 110, those skilled in the art understand that the substrate 110 could be many other layers without departing from the scope of the present invention.

The substrate 110 may, regardless of its location, comprise a variety of materials. In certain embodiments of this invention, the material composition of the substrate 110 is very important. For example, the material composition of the substrate 110 may be predetermined and optimized to cause an etchant used thereon to etch at a certain rate. Particularly, the material composition of the substrate 110 may be configured to cause the substrate 110 to etch fast enough that its resulting sidewalls are substantially vertical. For example, without limitation, the substrate 110 may be selected from the group of materials including fluoro silicate glass (FSG), phospho silicate glass (PSG) and organo silicate glass (OSG). In an alternative embodiment, however, the material composition of the substrate 110 is less important than the particular etchant used to etch that layer. Nonetheless, a number of disclosed, as well as undisclosed materials may be used for the substrate 110.

Formed over the substrate 110 in the embodiment shown in FIG. 1 is an intermediate layer 120. The intermediate layer 120, in contrast to any prior art intervening layers, allows the final via in the substrate 110 to have a substantially smaller via opening width than was originally obtainable in the prior art. Of importance to the intermediate layer 120 is its material composition and/or thickness. Depending on which embodiment of the present invention is being used, the material composition and/or thickness may also be very instrumental.

While a number of known intermediate layer 120 material compositions may work, it has been observed during developing the present invention that a bottom anti-reflective coating (BARC) layer is particularly useful as the intermediate layer 120. As the BARC layer is currently already included within many photolithographic processing procedures, if tailored correctly, it may play a dual function. In other words it may act as an anti-reflective coating as well as a layer that allows the via opening width to be substantially reduced. For example a standard AR19 BARC layer available from Shipley Company, with a primary place of business at 455 Forest Street, Marlborough, Mass. 01752, might be used. Other intermediate layer materials may be used, including without limitation silicon nitride and silicon carbide.

Notwithstanding the material composition of the intermediate layer 120, and depending on the particular embodiment being used to manufacture the via, high etch selectivity between the intermediate layer 120 and substrate 110 would generally be desired. If the BARC layer were not used as the intermediate layer 120, other materials such as silicon, silicon carbide, tantalum nitride, etc., could otherwise be used.

As indicated above, the thickness of the intermediate layer 120 is of particular importance. For example, for a given initial opening width, the thickness of the intermediate layer is almost as important as the degree of slope of the sidewall angles, when determining the lower width of the intermediate layer 120 opening. Nonetheless, it is believed that an intermediate layer thickness ranging from about 20 nm to about 100 nm would suffice.

Figure 2:
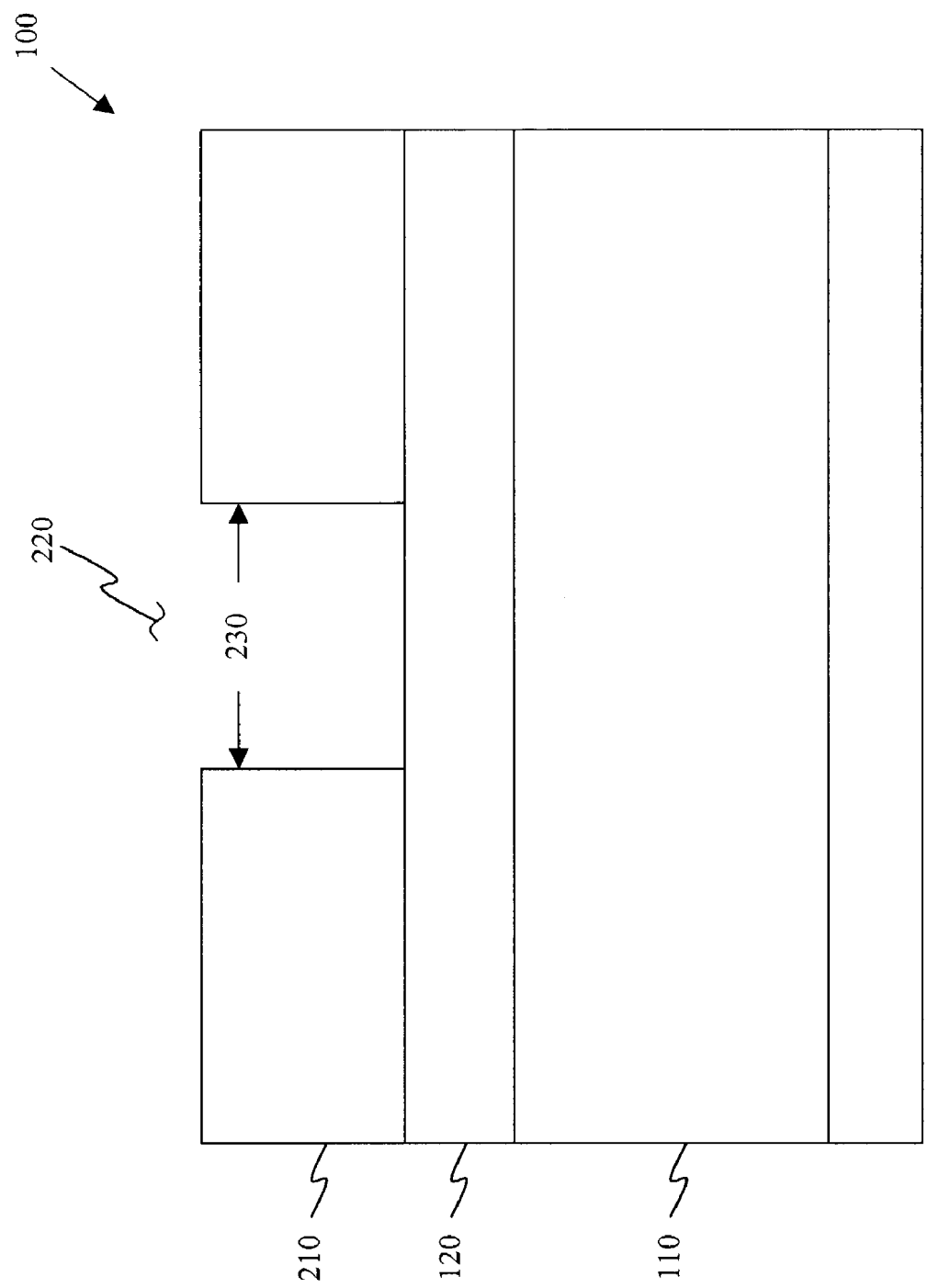
FIG. 2 illustrates a cross-sectional view of the partially completed via structure illustrated in FIG. 1 after a photoresist layer has been conventionally blanket deposited over the intermediate layer and patterned.

Turning now to FIG. 2, illustrated is a cross-sectional view of the partially completed via structure 100 illustrated in FIG. 1 after a photoresist layer 210 has been conventionally blanket deposited over the intermediate layer 120 and patterned. The photoresist layer 210, which may comprise any known or hereafter discovered photoresist material, may have a range of thicknesses while staying within the broad scope of the present invention. Namely, however, the photoresist layer 210 is a conventional organic photoresist layer having a thickness ranging from about 250 nm to about 500 nm, and particularly, about 330 nm to about 380 nm.

As is illustrated in FIG. 2, the patterned photoresist layer 210 has an opening 220 located therein having a predetermined width 230. Those skilled in the art understand the procedure for forming the opening 220 in the photoresist layer 210, including conventionally flashing, developing and washing the photoresist layer 210. Conventional lithography techniques currently limit the minimum predetermined opening width 230 that can be obtained within the photoresist layer 210, or alternatively, cost entirely too much to obtain such an opening that the technique is cost-prohibitive. Accordingly, the predetermined width 230 for the opening 220 in the photoresist layer 210 should range from about 100 nm to about 150 nm.

Figure 3:
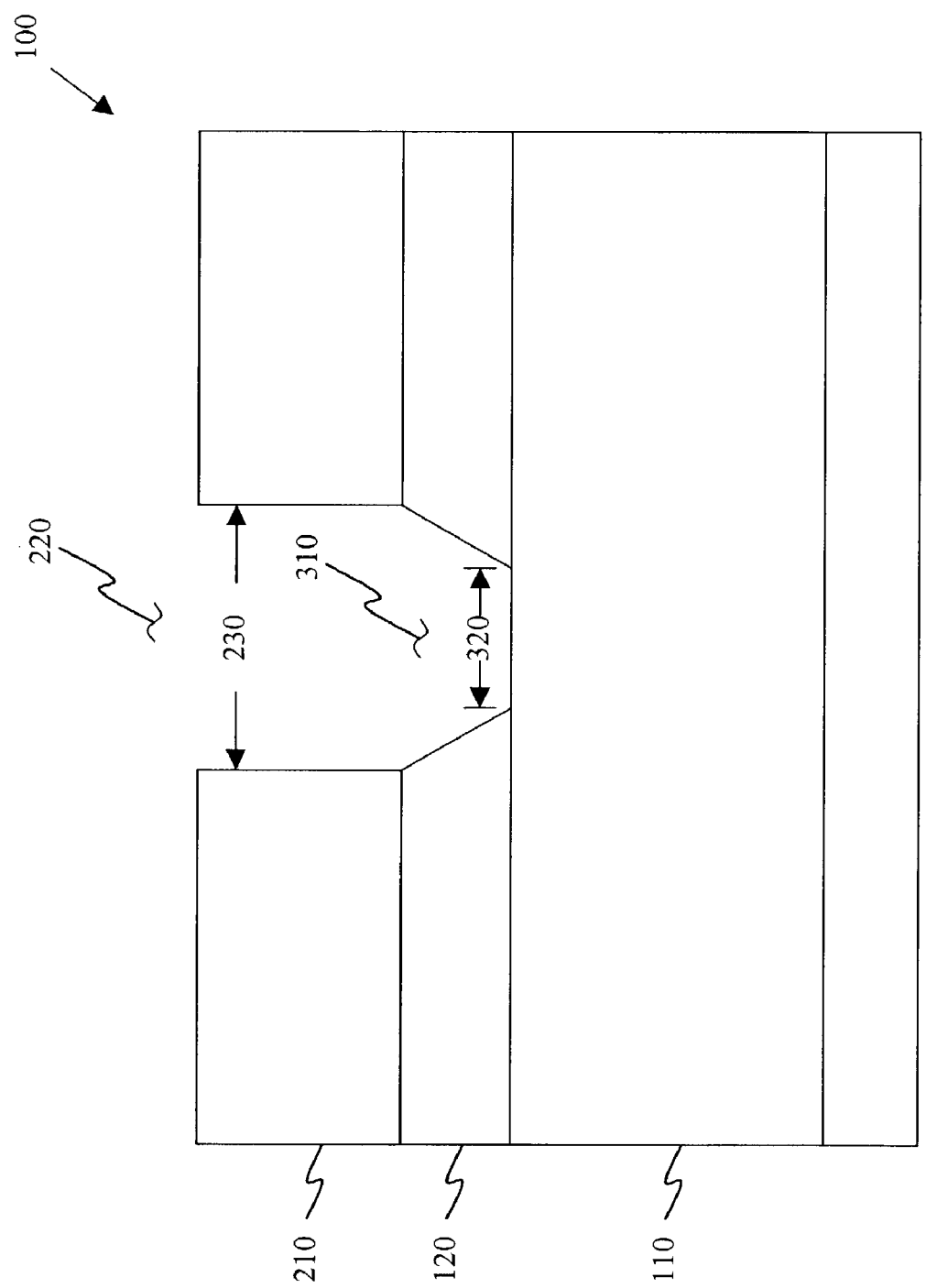
FIG. 3 illustrates a cross-sectional view of the partially completed via structure illustrated in FIG. 2 after etching through the intermediate layer such that an intermediate opening is formed therein.

Turning now to FIG. 3, illustrated is a cross-sectional view of the partially completed via structure 100 illustrated in FIG. 2 after etching through the intermediate layer 120 such that an intermediate opening 310 is formed therein. As is noticed in FIG. 3, the intermediate opening 310 has a decreasing width that terminates at a targeted width 320 that is less than the predetermined width 230.

As indicated previously, it is believed that the sloping sidewalls are at least in part caused by the slow etching rate of either the etchant forming the opening 310 and/or the material composition of the intermediate layer 120. In one instance, the slower etch rate permits more polymer deposition on the feature sidewalls being formed through the intermediate layer 120, causing the sidewalls to slope. Thus, for instance, a material having a slower etch rate for the chosen process gas composition could be used as the intermediate layer 120, or alternatively, an etchant having a slow etch rate could be used, or both. Often times, the polymer composition and concentration of the etch chemistry used determines this etch rate, and therefore increasing or decreasing degree of slope. However, notwithstanding the actual process and/or material make-up used to form the sloped sidewalls in the opening 310, nor the actual cause for the sloped sidewalls in the opening 310, their presence allows the predetermined width 230 to be substantially reduced to the targeted width 320.

Obviously, the difference between the predetermined width 230 and the targeted width 320 is based upon the material chosen and/or etchant chosen, and thus, the sidewall angle of the intermediate opening 310 and/or the thickness of the intermediate layer 120. It is believed that an optimal degree of slope for the intermediate opening 310 ranges from about 60 degrees to less than about 87 degrees, with an exemplary value ranging from about 75 degrees to about 85 degrees. A degree of slope of 87 degrees or above would generally render the intermediate opening 310 sidewalls substantially vertical, and therefore, the intermediate layer 120 would be of limited use.

Figure 4A:
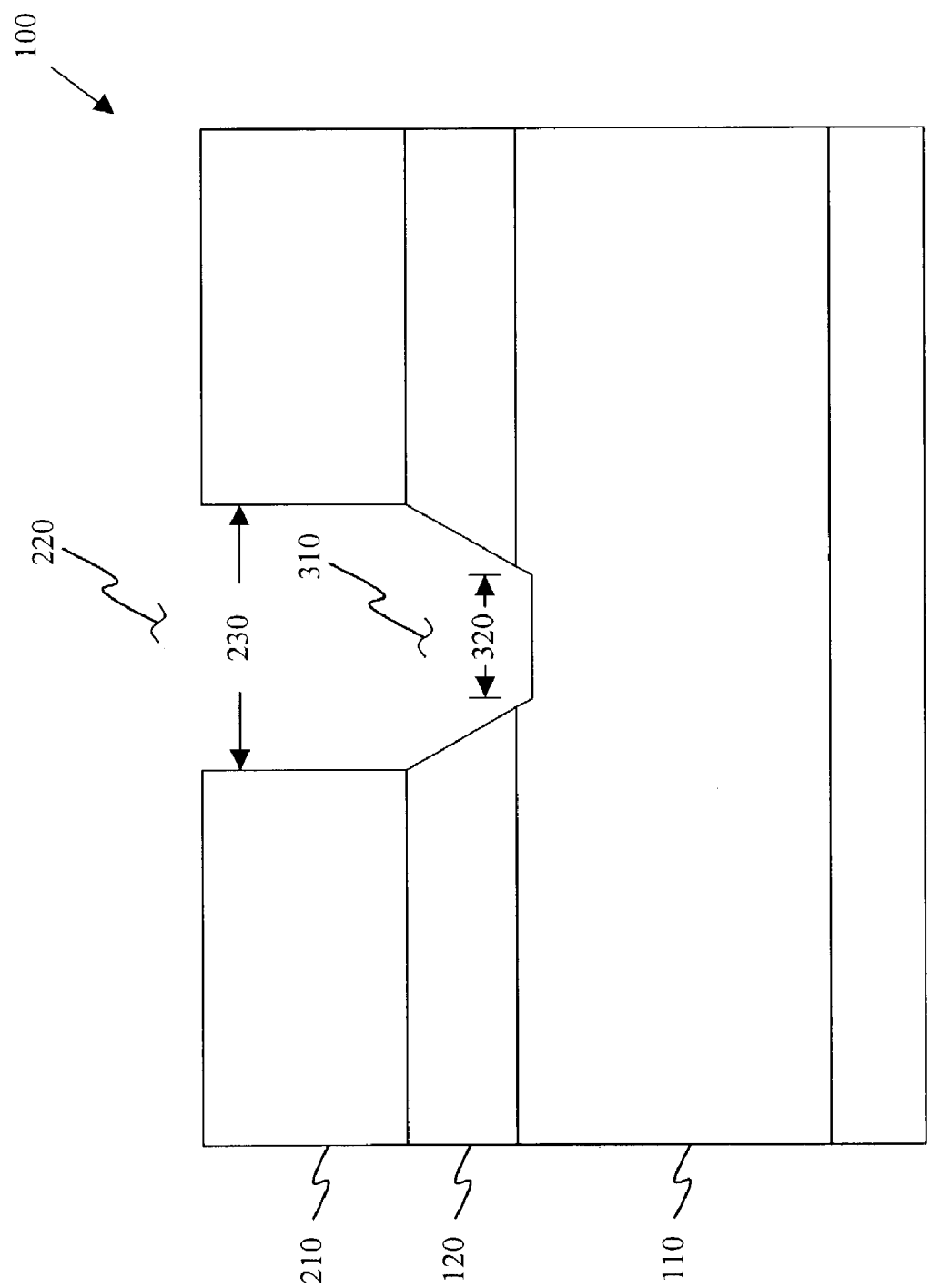
FIGS. 4A and 4B illustrate cross-sectional views of the partially completed via structure illustrated in FIG. 3 after continuing the etching within the intermediate opening and at least partially into the substrate.
Figure 4B:
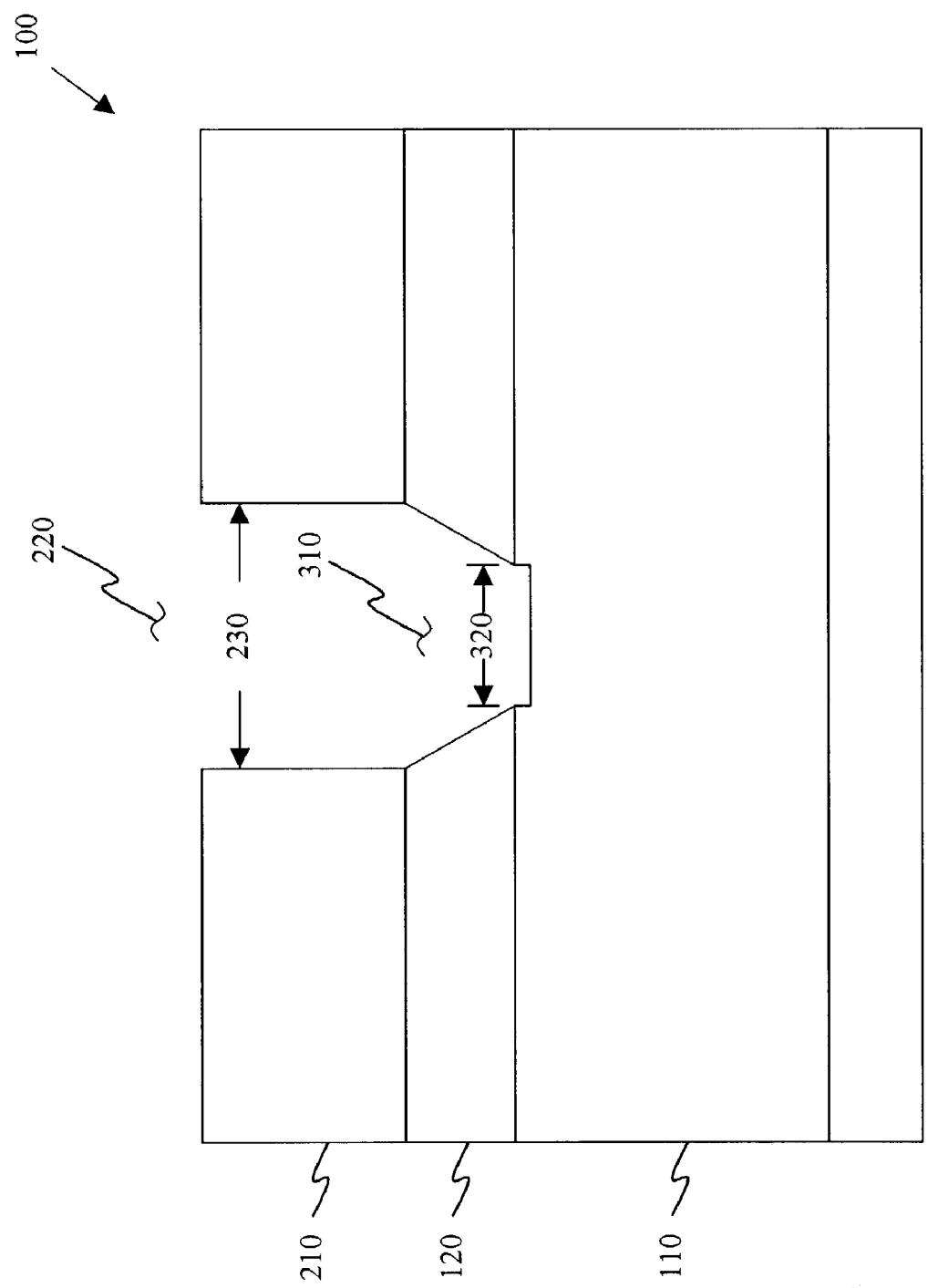

Turning now to FIGS. 4A and 4B, illustrated are cross-sectional views of the partially completed via structure 100 illustrated in FIG. 3 after continuing the etching within the intermediate opening 310 and at least partially into the substrate 110. With reference to FIG. 4A, shown is an embodiment where the slow etch rate was mostly a function of the etchant used, and not the etchant selectivity between the substrate 110 and the intermediate layer 120. Notice that as the etching continues into the substrate 110 the sloped sidewalls remain. As the sloped sidewalls are generally not desired in the via formed within the substrate 110, it is optimal to stop the etching as soon as the intermediate opening 310 passes through the entire intermediate layer 120 and into the substrate 110.

Therefore, in the embodiment of FIG. 4A a first etchant having a first etch rate may be used to etch through the intermediate layer 120 and at least partially into the substrate 110, and subsequent thereto a second etchant having a second faster etch rate could be used to complete the via opening in the substrate 110. While those skilled in the art understand that the chemical make-up of the first and second etchants are largely dependent on the material make-up of the intermediate layer 120 and substrate 110, respectively, in one embodiment of the invention the first etchant is selected having a first etchant gas ratio and the second etchant is selected having a different second etchant gas ratio. For example, the first etchant gas ratio could cause a larger amount of polymerization than the second etchant gas ratio.

Turning now to FIG. 4B, shown is an embodiment where the slow etch rate in the intermediate layer 120 is a function of the material composition of the intermediate layer 120, and likewise, the faster etch rate in the substrate 110 is a function of the material composition of the substrate 110. Notice in this embodiment that as the etching continues into the substrate 110 the sloped sidewalls do not remain. Because the etching rate increases once the etchant makes it through the intermediate layer 120 and into the substrate 110, the sloped sidewalls no longer exist. Actually, in this embodiment, the initial etch step could continue without stopping until the via opening is formed through the substrate 110, such as shown in FIG. 5.

While FIGS. 4A and 4B have been used to show the different techniques that could be used to form the sloped sidewalls within the intermediate layer 120, those skilled in the art understand that a combination of both techniques could also be used. In such an embodiment, an increased amount of control could be afforded to the process. As those skilled in the art are well aware, control is always a positive attribute in a patterning process.

Figure 5:
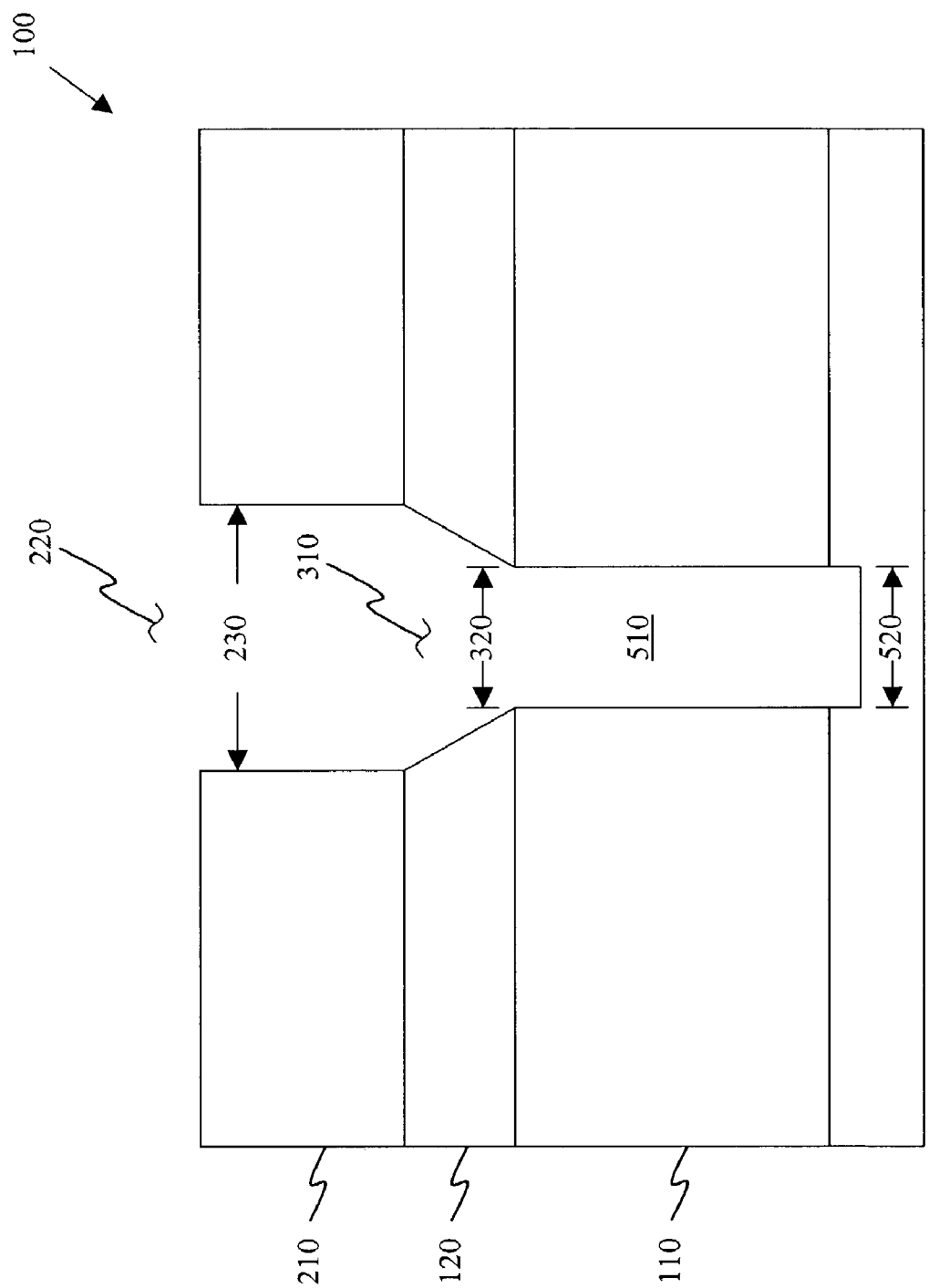
FIG. 5 illustrates a cross-sectional view of the partially completed via structure illustrated in FIGS. 4A and 4B after etching through the substrate such that a via opening is formed therein.

Turning now to FIG. 5, illustrated is a cross-sectional view of the partially completed via structure 100 illustrated in FIGS. 4A and 4B after etching through the substrate 110 such that a via opening 510 is formed therein. In the present embodiment, the via opening 510 has a via opening width 520 that is substantially equal to the targeted width 320. This attribute is only possible if the sidewalls of the via opening 510 are substantially vertical. In an exemplary embodiment, the via opening width ranges from about 80 nm to about 130 nm, however, other widths are within the scope of the present invention.

No other known process allows the sidewalls of the via opening 510 to be substantially vertical, while allowing the via opening width 520 to be substantially smaller than the minimum photoresist opening width currently obtainable with today's photolithographic processes. For example, in an advantageous embodiment the ratio of the width 230 of the opening 220 in the photoresist layer 210 and the via opening width 520 is about 12:10.5. In an alternative embodiment, the ratio of the width 230 of the opening 220 in the photoresist layer 210 and the via opening width 520 is even greater and, thus, about 12:8.

After completely etching through the substrate 110 such that a via opening 510 is formed therein, the remaining photoresist layer 210 and intermediate layer 120 may be conventionally removed. What results is a via opening 510 having a via opening width 520 that is substantially reduced from that in the prior art, while also having substantially vertical sidewall angles.

While the present invention has been described as only requiring an intermediate layer 120 located over a substrate 110, those skilled in the art understand that various other layers could be included above, between or below either of the substrate 110 or the intermediate layer 120. For example, optionally located between the substrate 110 and the intermediate layer 120 may be a barrier layer. While not required, the barrier layer helps define the final via opening 510 formed within the substrate 110. The barrier layer, may comprise a variety of materials and thicknesses. Among others, a silicon nitride barrier layer is useful. Likewise, and among others, a barrier layer thickness ranging from about 15 nm to about 60 nm, and more specifically about 25 nm to about 35 nm, has been found to be very useful.

Additionally, optionally located between the barrier layer and the intermediate layer 120 may be a sacrificial hard mask layer. The sacrificial hard mask layer may comprise a variety of different materials, however, a tetraethylorhtosilicate (TEOS) layer works well. Similarly, the sacrificial hard mask layer may have a wide range of thicknesses. For example, thicknesses between about 2 nm and about 10 nm, and more specifically a thickness of about 5 nm, have been found to work very well with the present invention.

Figure 6:
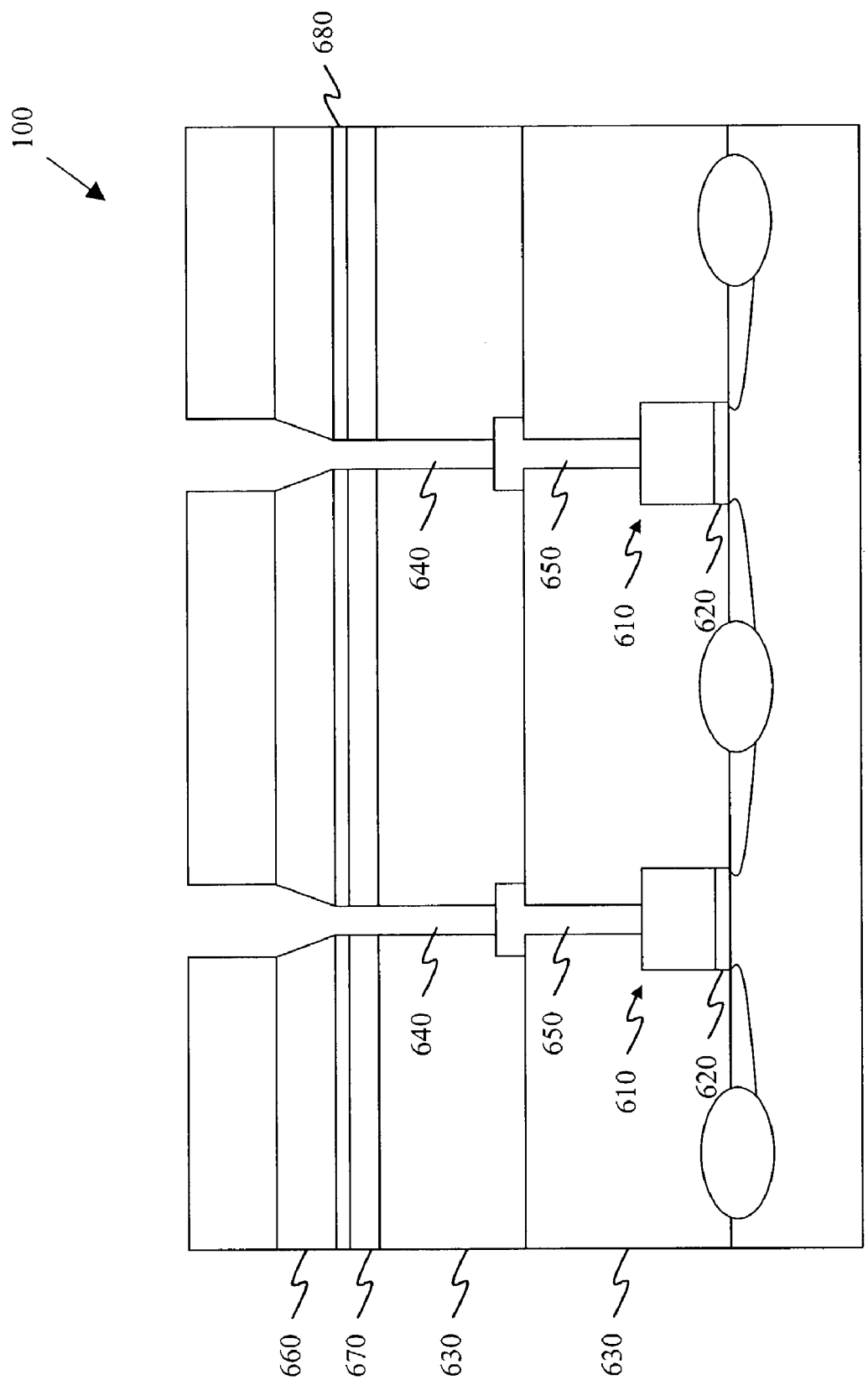
FIG. 6 illustrates a cross-sectional view of a conventional integrated circuit that might be manufactured according to the principles of the present invention.

Turning briefly to FIG. 6, there is illustrated a cross-sectional view of an integrated circuit 600 that might be manufactured according to the principles of the present invention. The integrated circuit 600 may include a CMOS device, a BiCMOS device, a Bipolar device, or other type of integrated circuit device. Shown in FIG. 6 are components of the integrated circuit 600, including: transistors 610, including the gate oxide layer 620, and interlevel dielectric layers 630, in which via openings 640 in accordance with the present invention have been included. In the embodiment shown in FIG. 6, the via openings 640 and contacts 650 formed therein connect the transistors 610 to other areas of the integrated circuit 600. In addition to the intermediate layer 660, the integrated circuit 600 includes a barrier layer 670 and a sacrificial hard mask layer 680.

Although the present invention has been described in detail, those skilled in the art should understand that they can make various changes, substitutions and alterations herein without departing from the spirit and scope of the invention in its broadest form.

What is claimed is:

1. A method for forming a via in a substrate, comprising:
    patterning an opening in a photoresist layer located over an intermediate layer located over a substrate, said opening having a predetermined width;
    etching into said intermediate layer such that an intermediate opening is formed, said intermediate opening having a decreasing width that terminates at a targeted width less than said predetermined width and having a degree of slope ranging from about 60 degrees to less than about 87 degrees; and
    continuing said etching within said intermediate opening and at least partially into said substrate to form a via opening in said substrate wherein a width of said via opening is substantially equal to said targeted width.

2. The method as recited in claim 1 wherein sidewalls of said via opening are substantially vertical.

3. The method as recited in claim 1 wherein a ratio of said width of said opening in said photoresist layer and said via opening ranges from about 12:10.5 to about 12:8.

4. The method as recited in claim 3 wherein said width of said opening in said photoresist layer ranges from about 100 nm to about 150 nm and said width of said via opening ranges from about 80 nm to about 130 nm.

5. The method as recited in claim 1 wherein etching into said intermediate layer and at least partially into said substrate includes etching through said intermediate layer using a first etchant, and said method further including etching through said substrate to form a via opening using a second etchant.

6. The method as recited in claim 5 wherein said first etchant causes said intermediate layer to etch at a first rate, and said second etchant causes said substrate to etch at a second, faster rate.

7. The method as recited in claim 6 wherein said first etchant is selected having a first etchant gas ratio and the second etchant is selected having a different second etchant gas ratio.

8. The method as recited in claim 1 wherein said intermediate layer comprises a material having a first etch rate and said substrate comprises a material having a second, faster etch rate.

9. The method as recited in claim 8 wherein said intermediate layer is selected from the group of materials including BARC, silicon nitride and silicon carbide, and said substrate is selected from the group consisting of fluoro silicate glass (FSG), phospho silicate glass (PSG) and organo silicate glass (OSG).

10. The method as recited in claim 1 further including removing said intermediate layer subsequent to said continuing said etching.

11. A method for manufacturing an integrated circuit, including:
    forming transistors over a semiconductor substrate;
    placing an interlevel dielectric layer over said transistors; and
    creating vias in said interlevel dielectric layer, including;
        patterning openings in a photoresist layer located over an intermediate layer located over said interlevel dielectric layer, said opening having a predetermined width;
        etching into said intermediate layer such that an intermediate opening is formed, said intermediate opening having a decreasing width that terminates at a targeted width less than said predetermined width and having a degree of slope ranging from about 60 degrees to less than about 87 degrees; and
        continuing said etching within said intermediate opening and at least partially into said interlevel dielectric layer to form a via opening in said interlevel dielectric layer wherein a width of said via opening is substantially equal to said targeted width.

12. The method as recited in claim 11 wherein sidewalls of said via opening are substantially vertical.

13. The method as recited in claim 11 wherein a ratio of said width of said opening in said photoresist layer and said via opening ranges from about 12:10.5 to about 12:8.

14. The method as recited in claim 13 wherein said width of said opening in said photoresist layer ranges from about 100 nm to about 150 nm and said width of said via opening ranges from about 80 nm to about 130 nm.

15. The method as recited in claim 11 wherein etching into said intermediate layer and at least partially into said interlevel dielectric layer includes etching through said intermediate layer using a first etchant, and said method further including etching through said interlevel dielectric layer to form a via opening using a second etchant.

16. The method as recited in claim 15 wherein said first etchant causes said intermediate layer to etch at a first rate, and said second etchant causes said interlevel dielectric layer to etch at a second, faster rate.

17. The method as recited in claim 11 wherein said intermediate layer comprises a material having a first etch rate and said interlevel dielectric layer comprises a material having a second, faster etch rate.

18. The method as recited in claim 11 further including removing said intermediate layer subsequent to said continuing said etching.

* * * * *